US009466478B2

(12) United States Patent
Shimizu et al.

(10) Patent No.: US 9,466,478 B2
(45) Date of Patent: Oct. 11, 2016

(54) FILM FORMING METHOD AND FILM FORMING APPARATUS

(71) Applicant: TOKYO ELECTRON LIMITED, Tokyo (JP)

(72) Inventors: Akira Shimizu, Nirasaki (JP); Tsuyoshi Tsunatori, Nirasaki (JP); Shigeru Nakajima, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 153 days.

(21) Appl. No.: 14/229,431

(22) Filed: Mar. 28, 2014

(65) Prior Publication Data

US 2014/0295677 A1      Oct. 2, 2014

(30) Foreign Application Priority Data

Mar. 29, 2013   (JP) .................................. 2013-073125

(51) Int. Cl.
| | |
|---|---|
| *C23C 16/00* | (2006.01) |
| *H01L 21/02* | (2006.01) |
| *C23C 16/40* | (2006.01) |
| *C23C 16/455* | (2006.01) |

(52) U.S. Cl.
CPC ......... *H01L 21/0228* (2013.01); *C23C 16/405* (2013.01); *C23C 16/45527* (2013.01); *C23C 16/45561* (2013.01); *H01L 21/02189* (2013.01)

(58) Field of Classification Search
CPC .......... C23C 16/405; C23C 16/45527; C23C 16/45561

USPC ....................................................... 427/248.1
See application file for complete search history.

(56) References Cited

U.S. PATENT DOCUMENTS

| | | | |
|---|---|---|---|
| 2006/0199384 A1* | 9/2006 | Ando .................... | C23C 16/401 438/680 |
| 2009/0047798 A1* | 2/2009 | Clark ..................... | C23C 16/40 438/778 |

FOREIGN PATENT DOCUMENTS

| | | |
|---|---|---|
| JP | 02-259074 A | 10/1991 |
| JP | 2000-54134 A | 2/2000 |
| JP | 2001-152339 A | 6/2001 |
| JP | 2006-269621 A | 10/2006 |
| JP | 2006-279019 | 10/2006 |
| JP | 2006-310754 A | 11/2006 |
| JP | 2008-53326 A | 3/2008 |
| JP | 2009-76542 A | 4/2009 |

* cited by examiner

*Primary Examiner* — Kelly M Gambetta
(74) *Attorney, Agent, or Firm* — Nath, Goldberg & Meyer; Jerald L. Meyer (57) ABSTRACT

A method of forming an oxide film on an object to be processed, includes: supplying a film-forming raw material gas into a processing chamber; performing at least one of exhausting the processing chamber and supplying a purge gas into the processing chamber to remove gas remaining in the processing chamber; supplying an oxidant gas into the processing chamber; and performing at least one of exhausting the processing chamber and supplying the purge gas into the processing chamber to remove gas remaining in the processing chamber, wherein supplying an oxidant gas includes: supplying a first oxidant gas into the processing chamber at a first concentration; and supplying a second oxidant gas into the processing chamber at a second concentration higher than the first concentration.

8 Claims, 6 Drawing Sheets

Comparative Example

FIG. 5B

Embodiment

FIG. 6

FILM FORMING METHOD AND FILM FORMING APPARATUS

CROSS-REFERENCE TO RELATED APPLICATION

This application claims the benefit of Japanese Patent Application No. 2013-073125, filed on Mar. 29, 2013, in the Japan Patent Office, the disclosure of which is incorporated herein in its entirety by reference.

TECHNICAL FIELD

The present disclosure relates to a film forming method and a film forming apparatus.

BACKGROUND

Recently, an increasing number of highly-integrated and high speed Large Scale Integrated (LSI) circuits is in demand. Thus, design rules of semiconductor elements constituting the LSI circuits are increasingly miniaturized. Such miniaturization requires further decreasing the thickness of a gate insulating film used in a CMOS device, which creates a need for the gate insulating film to be made of a material having high permittivity. In addition, there is a need to increase the number of capacitors used in Dynamic Random Access Memories (DRAMs) or the like. There is also a need to improve a permittivity of a dielectric film used in the capacitors. In addition, a flash memory is required to have a further improved reliability. As such, the gate insulating film formed between a control gate and a floating gate is required to have a high permittivity.

An oxide material such as a zirconium oxide ($ZrO_2$) film is being studied as a high-permittivity material which is adaptable to address the above requirements. The zirconium oxide film is formed by a chemical vapor deposition (CVD) (or a metal organic chemical vapor deposition (MOCVD)) using an organic metal material. In addition, as a method of forming the zirconium oxide film, there is proposed an ALD process which alternately supplies tetrakisethylmethylamino zirconium (TEMAZ) used as a raw material gas (precursor) and an $O_3$ gas used as an oxidant gas.

An in-plane uniformity of a metal oxide film such as the zirconium oxide film, which is obtained by the existing ALD process is 3 to 10%. Although the in-plane uniformity of the metal oxide film in the existing LSIs is sufficient with 3%, there is a need for an in-plane uniformity of less than 3% in consideration of miniaturization of future LSIs.

However, in the existing ALD process, the in-plane uniformity is hardly lower than 3%. Deterioration of the in-plane uniformity is drastically manifested when an oxidizing power of an $O_3$ gas is strengthened to make the metal oxide film denser. For example, assuming that a concentration of the $O_3$ gas is increased to strengthen the oxidizing power thereof, the $O_3$ gas having the increased concentration may oxidize ligands in addition to the precursor adsorbed onto a wafer.

When an organic metal is used as the precursor, the ligands become organic ligands such as $CH_3$ or $C_2H_5$. Oxidation of the organic ligands generates a $H_2O$ or $CO_x$ gas. In addition, if nitrogen is contained in the organic metal, a $NO_x$ gas may be further generated.

In particular, the $H_2O$ gas inactivates the $O_3$ gas. As such, a central portion of the wafer is hardly oxidized, thus causing the metal oxide film formed on the wafer to be thick at a periphery of the wafer and thin at the central portion thereof.

SUMMARY

Some embodiments of the present disclosure provide a method and apparatus which is capable of forming a metal oxide film having a dense and good in-plane uniformity even when a concentration of an oxidant gas used in oxidizing metal is increased to strengthen an oxidizing power thereof.

According to one embodiment of the present disclosure, there is provided a method of forming an oxide film on an object to be processed, includes: supplying a film-forming raw material gas into a processing chamber; performing at least one of exhausting the processing chamber and supplying a purge gas into the processing chamber to remove gas remaining in the processing chamber; supplying an oxidant gas into the processing chamber; and performing at least one of exhausting the processing chamber and supplying the purge gas into the processing chamber to remove gas remaining in the processing chamber, wherein supplying an oxidant gas includes: supplying a first oxidant gas into the processing chamber at a first concentration; and supplying a second oxidant gas into the processing chamber at a second concentration higher than the first concentration.

According to another embodiment of the present disclosure, there is provided a film forming apparatus, which includes: a processing chamber in which an oxide film is formed on each of a plurality of objects to be processed accommodated therein; a film-forming raw material gas source configured to supply a film-forming raw material gas into the processing chamber; an oxidant gas supply source configured to supply an oxidant gas into the processing chamber; a purge gas supply source configured to supply a purge gas into the processing chamber; an exhausting unit configured to exhaust the processing chamber; and a controller configured to control the film-forming raw material gas source, the oxidant gas supply source, the purge gas supply source and the exhausting unit to perform the aforementioned film forming method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. Throughout the drawings, the same elements are denoted by the same reference numerals.

(Film Forming Apparatus)

Figure 1:
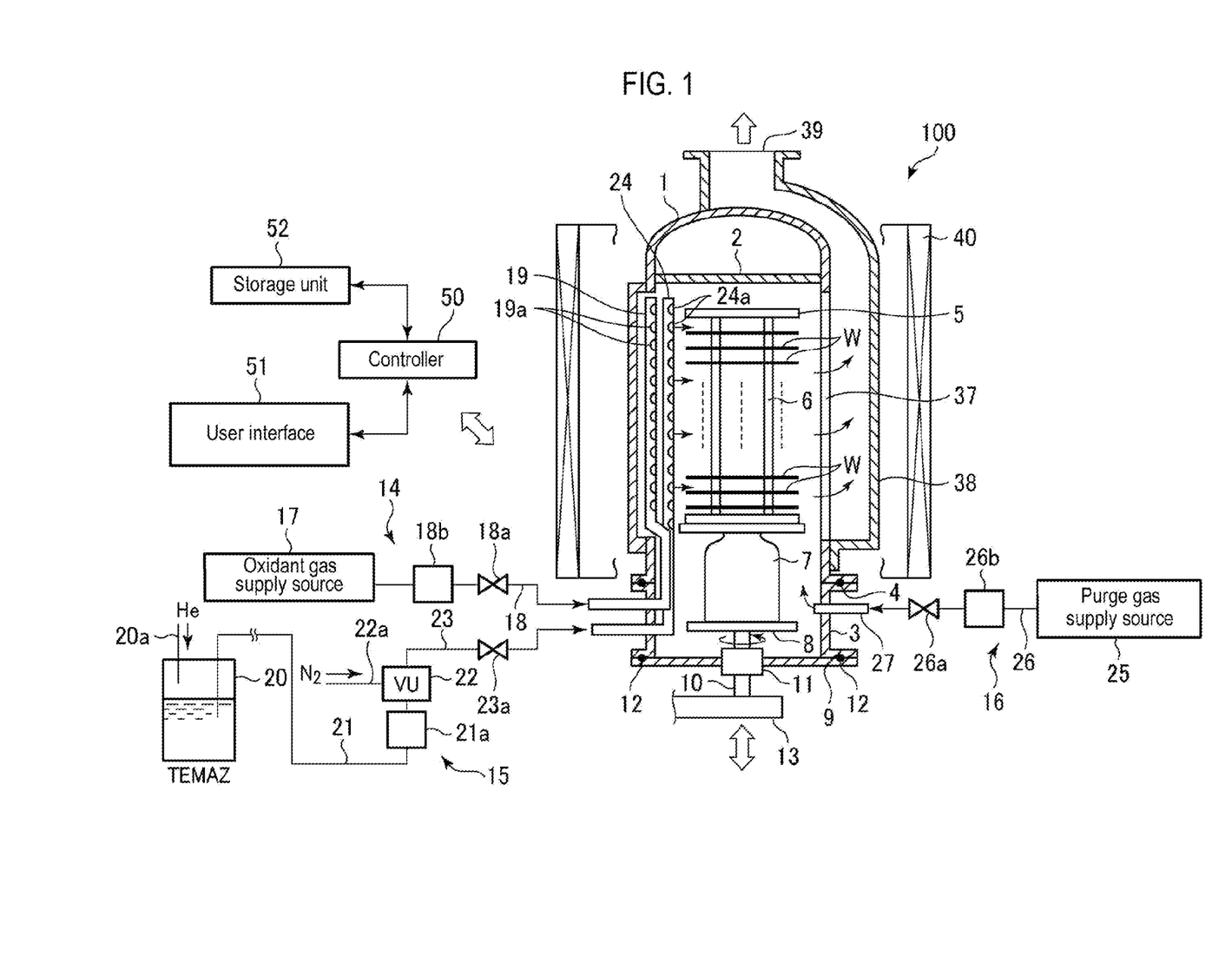
FIG. 1 is a longitudinal sectional view showing an example of a film forming apparatus according to a first embodiment of the present disclosure, which is capable of performing a film forming method according to a second embodiment of the present disclosure.
Figure 2:
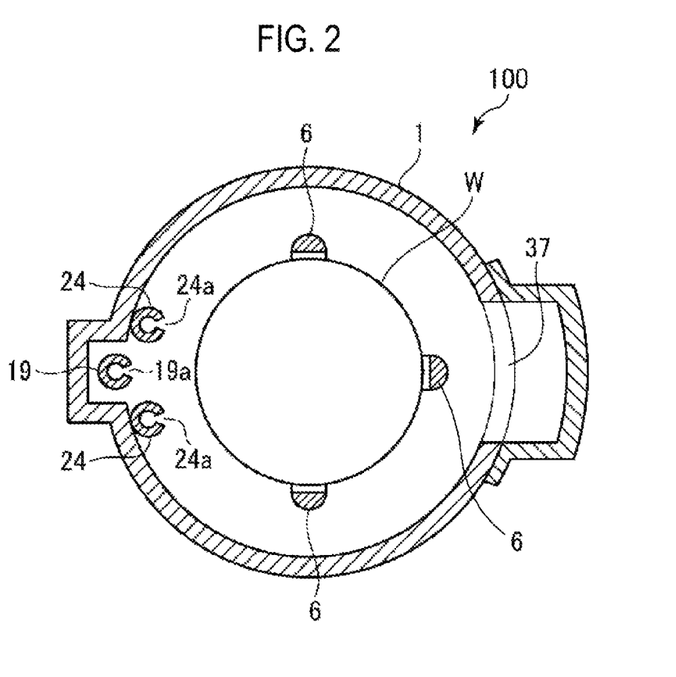
FIG. 2 is a transverse cross sectional view of the film forming apparatus shown in FIG. 1.

FIG. 1 is a longitudinal sectional view showing an example of a film forming apparatus 100 according to a first embodiment of the present disclosure, which is capable of performing a film forming method according to a second embodiment of the present disclosure. FIG. 2 is a transverse cross sectional view of the film forming apparatus 100 shown in FIG. 1. A heating unit is omitted in FIG. 2.

The film forming apparatus 100 includes a cylindrical-shaped processing chamber 1 having a ceiling, of which a lower end portion is opened. The entirety of the processing chamber 1 is formed of, e.g., quartz. A ceiling plate 2 of quartz is installed at the ceiling inside the processing chamber 1 such that the processing chamber 1 is sealed. Also, a manifold 3 which is formed of, e.g., stainless steel to have a cylindrical shape, is connected to a lower end opening portion of the processing chamber 1 through a seal member 4 such as an O-ring.

The manifold 3 supports a lower end portion of the processing chamber 1. A wafer boat 5 of quartz, in which a plurality (e.g., 50 to 100) of semiconductor wafers (hereinafter, referred to as "wafers" simply) W are loaded as objects to be processed in multiple stages, is insertable into the processing chamber 1 through a lower portion of the manifold 3. The wafer boat 5 includes three support pillars 6 (see FIG. 2). Each of the plurality of wafers W is supported by grooves which are formed in each of the support pillars 6.

The wafer boat 5 is placed on a table 8 through a heat insulating tube 7 of quartz. The table 8 is supported on a rotation axis 10 that passes through a cover part 9 of the stainless steel. The cover part 9 opens or closes a lower end opening portion of the manifold 3.

A magnetic fluid seal 11 is installed at a through portion of the rotation axis 10. The magnetic fluid seal 11 closely seals and rotatably supports the rotation axis 10. Also, a seal member 12 such as an O-ring is installed between a peripheral portion of the cover part 9 and a lower end portion of the manifold 3, thus maintaining sealability in the processing chamber 1.

The rotation axis 10 is installed at a front end of an arm 13 that is supported by an ascending/descending mechanism such as a boat elevator. The rotation axis 10 ascends or descends the wafer boat 5 and the cover part 9 integratedly, and is inserted into or detached from the processing chamber 1. In some embodiments, the table 8 may be installed to be fixed to the cover part 9 side such that the wafer W is treated without the rotation of the wafer boat 5.

The film forming apparatus 100 further includes an oxidant gas supply mechanism 14 configured to supply an oxidant gas into the processing chamber 1, a film-forming raw material gas supply mechanism 15 configured to supply a film-forming raw material gas into the processing chamber 1, and a purge gas supply mechanism 16 configured to supply a purge gas into the processing chamber 1. An example of the oxidant gas may include an ozone ($O_3$) gas. An example of a thin film to be formed may include a metal oxide film such as a zirconium oxide ($ZrO_2$) film. An example of the film-forming raw material gas used to form the $ZrO_2$ film may include tetrakisethylmethylamino zirconium (TEMAZ). An example of the purge gas may include an inert gas such as a nitrogen ($N_2$) gas.

The oxidant gas supply mechanism 14 includes an oxidant gas supply source 17, an oxidant gas pipeline 18 through which the oxidant gas supplied from the oxidant gas supply source 17 flows into the processing chamber 1, and an oxidant gas dispersion nozzle 19 formed of a quartz pipe. The oxidant gas dispersion nozzle 19 is connected to the oxidant gas pipeline 18, and internally passes through a sidewall of the manifold 3. Further, the oxidant gas dispersion nozzle 19 is bent upwardly, and extends vertically. A plurality of gas discharge holes 19a is formed at certain intervals in a longitudinal portion of the oxidant gas dispersion nozzle 19 such that the oxidant gas (for example, the $O_3$ gas) is uniformly discharged from each of the gas discharge holes 19a into the processing chamber 1 in a horizontal direction.

The film-forming raw material gas supply mechanism 15 includes a Zr source reservoir 20 that stores a liquid Zr source as a film-forming raw material therein, a Zr source pipeline 21 through which the liquid Zr source stored in the Zr source reservoir 20 flows, a vaporizer (VU) 22 coupled to the Zr source pipeline 21 and configured to vaporize the Zr source, a Zr source gas pipeline 23 through which a Zr source gas generated in the vaporizer 22 flows, and a Zr source gas dispersion nozzle 24, which is formed of a quart pipe and connected to the Zr source gas pipeline 23. The Zr source gas dispersion nozzle 24 passes through the sidewall of the manifold 3 internally, is bent upwardly, and is extended vertically. A carrier gas pipeline 22a through which a nitrogen ($N_2$) gas as a carrier gas flows, is connected to the vaporizer 22. Here, two Zr source gas dispersion nozzles 24 are installed with the oxidant gas dispersion nozzle 19 interposed therebetween (see FIG. 2). A plurality of gas discharge holes 24a is formed at certain intervals in a longitudinal portion of each of the Zr source gas dispersion nozzles 24 such that the Zr source gas is uniformly discharged from each of the gas discharge holes 24a into the processing chamber 1 in a horizontal direction. Only one of the Zr source gas dispersion nozzles 24 may be installed.

The purge gas supply mechanism 16 includes a purge gas supply source 25, a purge gas pipeline 26 through which a purge gas supplied from the purge gas supply source 25 flows, and a purge gas nozzle 27 connected to the purge gas pipeline 26. The purge gas nozzle 27 is installed to pass through the sidewall of the manifold 3.

An opening/closing valve 18a and a flow rate controller 18b such as a mass flow controller are installed in the oxidant gas pipeline 18 such that the oxidant gas is supplied with its flow rate controlled. In addition, an opening/closing valve 26a and a flow rate controller 26b such as the mass flow controller are installed in the purge gas pipeline 26 such that the purge gas is supplied with its flow rate controlled.

A Zr source pressure-feed pipeline 20a is installed to be inserted into the Zr source reservoir 20. By supplying a pressure-feed gas such as a He gas through the Zr source gas pressure-feed pipeline 20a, the liquid Zr source stored in the Zr source reservoir 20 is discharged to the Zr source pipeline 21. A flow rate controller 21a such as a liquid mass flow controller is installed in the Zr source pipeline 21. An opening/closing valve 23a is installed in the Zr source gas pipeline 23.

An example of the Zr source may include an organic metal compound which is a liquid at room temperature, such as tetrakisethylmethylaminozirconium (TEMAZ). Another example of the Zr source may include tetrakisdiethyleaminozirconium (TDEAZ). In an alternative embodiment, the Zr source may be solid at room temperature. For the solid Zr source, a mechanism configured to vaporize the solid source and a mechanism configured to heat a related pipeline, and so on are required.

At a portion opposite to the oxidant gas dispersion nozzle 19 and the Zr source gas dispersion nozzles 24 in the processing chamber 1, an exhaust vent 37 is formed to vacuum-exhaust the processing chamber 1. The exhaust vent 37 has an elongated shape formed by vertically chipping a sidewall of the processing chamber 1. At a portion correspondingly outwardly to the exhaust vent 37 of the processing chamber 1, a cover member 38 with a C-shaped section is installed by welding to cover the exhaust vent 37. The cover member 38 extends upward along the sidewall of the processing chamber 1, and defines a gas outlet 39 at the top of the processing chamber 1. The processing chamber 1 is vacuumed through the gas outlet 39 by a vacuum-exhaust mechanism (not shown) including a vacuum pump. A tube-like heating unit 40, which is configured to heat the processing chamber 1 and the wafers W accommodated therein, is installed to surround an outer circumference of the processing chamber 1.

The respective units (or parts) of the film forming apparatus 100 are controlled by a controller 50 that is configured with a microprocessor such as a computer. For example, the controller 50 controls the supply/shutoff of each gas by operation of the opening/closing valves 18a, 23a and 26a, the control of the flow rate of the gaseous or liquid source by the flow rate controllers 18b, 21a and 26b, the control of the heating unit 40, etc. The controller 50 is connected to a user interface 51, which includes a keyboard or a touch panel display that enables an operator to input a command for managing the film forming apparatus 100, and a display that visually displays an operation status of the film forming apparatus 100.

Further, the controller 50 is connected to a storage unit 52, which stores control programs executed by the controller 50 for various processes of the film forming apparatus 100 or programs (i.e., recipes) for executing processes of the respective units (or parts) of the film forming apparatus 100 according to a processing condition. The recipes are stored in a storage medium of the storage unit 52. The storage medium may be a fixedly-installed medium such as a hard disk, or a portable medium such as a CDROM, a DVD, or a flash memory. Also, the recipes may be appropriately transferred from another device through a dedicated line.

Furthermore, depending on the case, the controller 50 reads an arbitrary recipe from the storage unit 52 and executes the read recipe according to a command that is inputted through the user interface 51. In this way, a desired processing is performed using the film forming apparatus 100 under the control of the controller 50.

(Film Forming Method)

Figure 3:
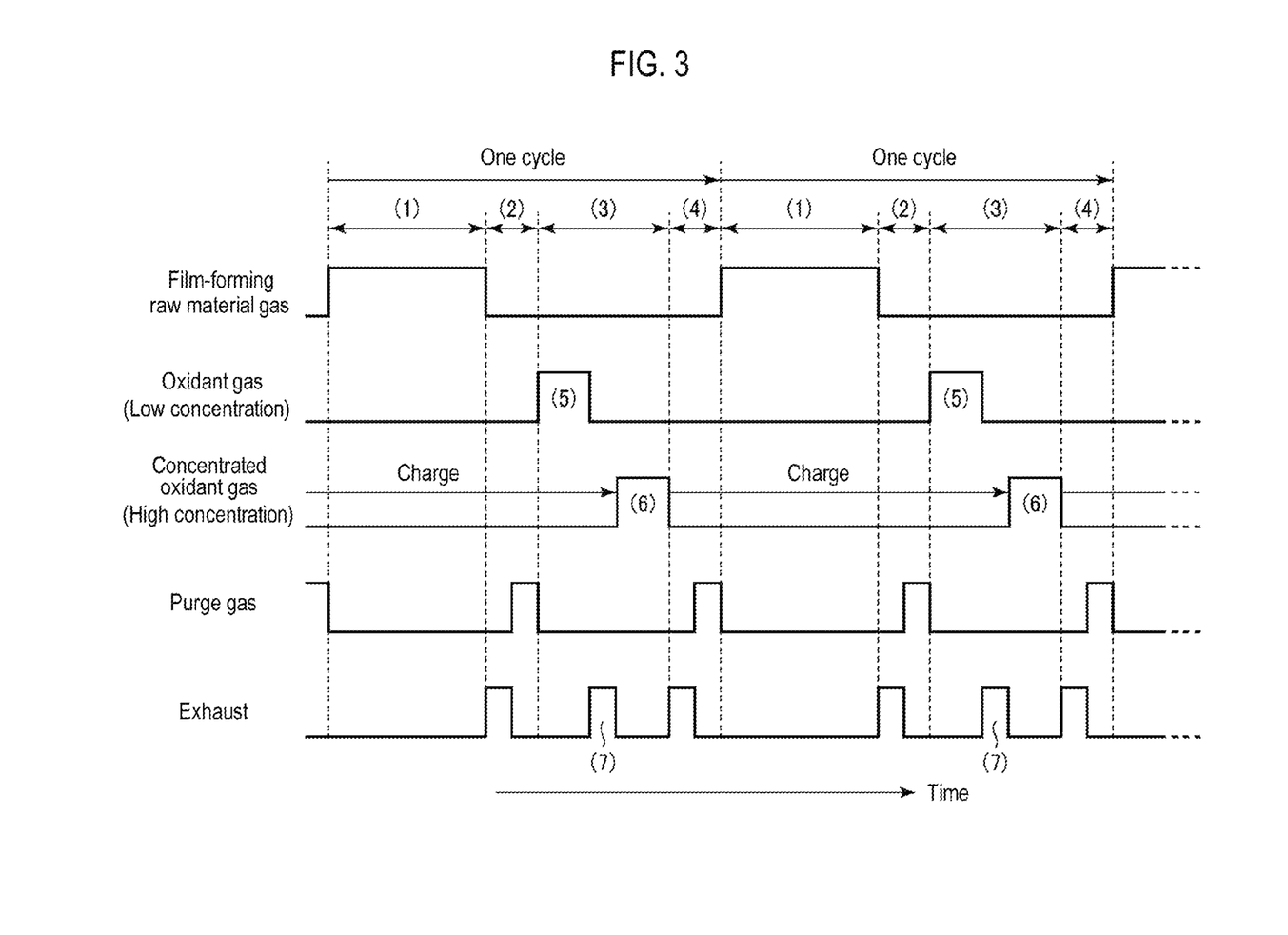
FIG. 3 is a timing chart showing an example of gas supply timings in the film forming method according to the second embodiment of the present disclosure.

Next, an example of the film forming method according to the second embodiment of the present disclosure will be described. In this embodiment, a film to be formed is an oxide film such as a metal oxide film. FIG. 3 is a timing chart showing an example of gas supply timings in the film forming method according to the second embodiment of the present disclosure. FIGS. 4A to 4D are views schematically showing a state of an object to be processed in major processes of this example.

Figure 4A:
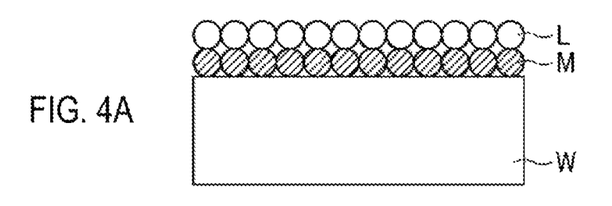
FIGS. 4A to 4D are views schematically showing a state of an object to be processed in major processes of the example shown in FIG. 3.

First, as indicated by process (1) in FIG. 3, a film-forming raw material gas is supplied into the processing chamber 1 in which objects to be processed (e.g., wafers) W are accommodated. In this example, the film-forming raw material gas is obtained by vaporizing TEMAZ. In this case, as shown in FIG. 4A, metals M whose bonds are coupled with ligands L are adsorbed onto a surface of the wafer W. The film-forming raw material gas obtained by vaporizing TEMAZ contains an organic metal precursor. This allows the ligands L to be organic ligands L. Specifically, in this example, zirconium (Zr) is used as the metal M and the ligands L become the organic ligands L whose nitrogen (N) is bounded with a hydrocarbon group such as a methyl group $(CH_3)$ or an ethyl group $(CH_2CH_3)$.

Subsequently, as indicated by process (2) in FIG. 3, the processing chamber 1 into which the film-forming raw material gas is supplied is exhausted, and subsequently, a purge gas is supplied into the processing chamber 1. Thus, gas remaining in the processing chamber 1 is removed, and an internal atmosphere of the processing chamber 1 is converted from a film-forming raw material gas atmosphere to an inert purge gas atmosphere.

Thereafter, as indicated by process (3) in FIG. 3, the oxidant gas is supplied into the processing chamber 1. In this example, the supply process (3) of the oxidant gas includes a first supply process (5) of supplying the oxidant gas at a first concentration and a second supply process (6) of supplying the oxidant gas at a second concentration higher than the first concentration.

In the supply process (3), the first supply process (5) of supplying the oxidant gas at the first concentration (a relatively low concentration) is first performed. In this example, an ozone $(O_3)$ gas is used as the oxidant gas. The first concentration of the $O_3$ gas in the first supply process (5) falls within a range of, e.g., 50 $g/Nm^3$ to 200 $g/Nm^3$. That is, the oxidant gas such as the $O_3$ gas, which falls within a range of 50 g to 200 g per 1 $m^3$, is supplied into the processing chamber 1.

Figure 4B:
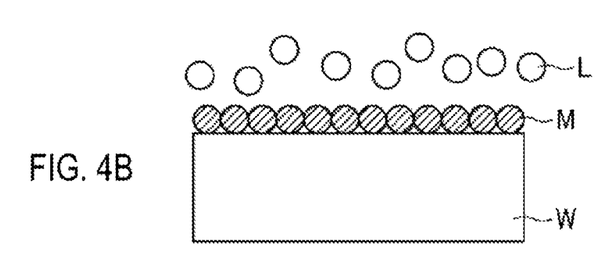

Subsequently, as shown in FIG. 4B, the organic ligands L contained in the organic metal precursor are separated from the organic metal precursor. As a result, only the metals M contained in the organic metal precursor remains on the wafer W.

In this example, each of the organic ligands L contains hydrocarbon. In this case, the first supply process (5) may be performed under conditions where the hydrocarbon-containing organic ligands L are cut and an oxidation does not progress.

An example of the conditions applied in the first supply process (5) is as follows:
Concentration of $O_3$ gas: 50 to 200 $g/Nm^3$
Flow rate of $(O_2+O_3)$ gas: 5 to 20 slm
Processing time: 30 sec to 2 min
Processing temperature: 200 to 300 degrees C.
Processing pressure: 66.5 to 266 Pa (0.5 to 2 Torr)

wherein, 1 Pa is defined as 133 Torr. The flow rate of the ($O_2$+$O_3$) gas represents a sum of flow rates of the rest of the $O_2$ gas used in generating the $O_3$ gas and the generated $O_3$ gas.

Figure 4C:
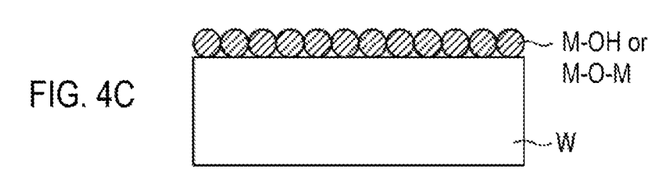

Subsequently, process (7) is performed where the processing chamber 1 is exhausted and the organic ligands L separated from the organic metal precursor are removed from the interior of the processing chamber 1. Thus, as shown in FIG. 4C, the organic ligands L are removed from the processing chamber 1. Then, a metal-hydroxy group (M-OH) or metal-oxygen-metal (M-O-M) (in this example, Zr—OH or Zr—O—Zr) is exposed and left on the wafer W in the processing chamber 1.

The first supply process (5) is then followed by the second supply process (6). In this example, an oxidant gas used in the second supply process (6) is the same $O_3$ gas as that used in the first supply process (5). When the same oxidant gas is used in both the first and second supply processes (5) and (6), the oxidant gas used in the second supply process (6) may be obtained by concentrating the oxidant gas used in the first supply process (5) at a relatively high level. Thus, a concentrated $O_3$ gas is generated. A concentration (i.e., the second concentration) of the concentrated $O_3$ gas used in the second supply process (6) falls within a range of, e.g., 200 g/$Nm^3$ to 500 g/$Nm^3$. Specifically, the concentrated $O_3$ gas falling within a range of 200 g to 500 g per 1 $m^3$ is supplied into the processing chamber 1.

Figure 4D:
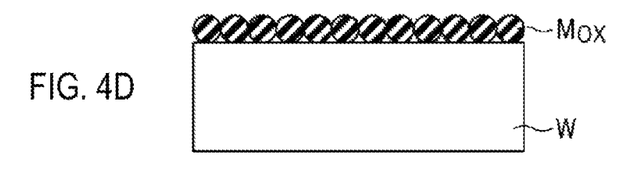

Upon the supply of the concentrated $O_3$ gas into the processing chamber 1, as shown in FIG. 4D, the metal-hydroxy group (M-OH) or the metal-oxygen-metal (M-O-M) remaining on the wafer W is oxidized so that a metal oxide film containing metal oxides (MOx) is formed on the wafer W. In this example, a zirconium oxide ($ZrO_2$) film is formed as the metal oxide film.

In the second supply process (6), an oxidizing power of the oxidant gas (the concentrated $O_3$ gas in this example) may be strengthened to form the metal oxide film having a dense and good quality. To do this, the $O_3$ gas having increased concentration is used. An example of detailed conditions applied in the second supply process (6) is as follows:

Concentration of $O_3$ gas: 200 to 500 g/$Nm^3$
Flow rate of ($O_2$+$O_3$) gas: 10 to 20 slm
Processing time: 30 sec to 3 min
Processing temperature: 200 to 300 degrees C.
Processing pressure: 66.5 to 266 Pa (0.5 to 2 Torr)

The concentration of the concentrated $O_3$ gas in the second supply process (6) includes 200 g/$Nm^3$, which overlaps with the concentration (200 g/$Nm^3$) of the $O_3$ gas in the first supply process (5). However, if the concentration of the concentrated $O_3$ gas in the second supply process (6) is set to be 200 g/$Nm^3$, the concentration of the $O_3$ gas in the first supply process (5) may be set to be a value lower than 200 g/$Nm^3$. Similarly, if the concentration of the $O_3$ gas in the first supply process (5) is set to be 200 g/$Nm^3$, the concentration of the concentrated $O_3$ gas in the second supply process (6) may set to be a value more than 200 g/$Nm^3$.

Subsequently, as indicated by process (4) of FIG. 3, the processing chamber 1 into which the oxidant gas is supplied is exhausted, and a purge gas is supplied into the processing chamber 1. Thus, gas remaining in the processing chamber 1 is removed so that the internal atmosphere of the processing chamber 1 is converted from the film-forming raw material gas atmosphere to the inert purge gas atmosphere.

Thereafter, one cycle including a series of processes (1) to (4) is repeated several times until the metal oxide film has a predetermined film thickness. Thus, the metal oxide film (the $ZrO_2$ film in this example) is formed on the wafer W.

(Metal Oxide Film)

Figure 5A:
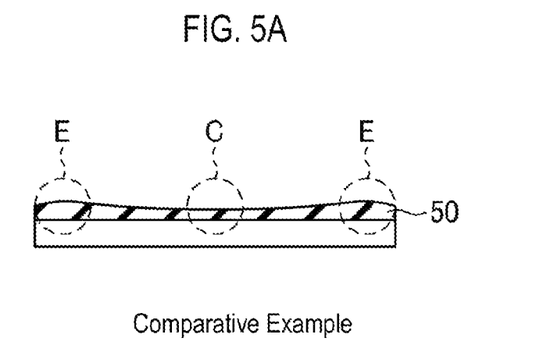
FIG. 5A is a cross sectional view of a metal oxide film formed using a film forming method according to a comparative example.
Figure 5B:
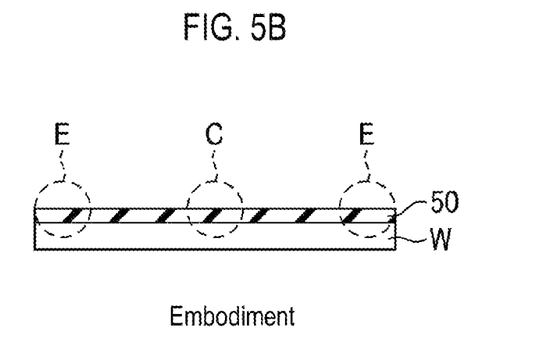
FIG. 5B is a cross sectional view of a metal oxide film formed using the film forming method according to the second embodiment of the present disclosure.

FIG. 5A is a sectional view showing a metal oxide film formed by a film forming method according to a comparative example, and FIG. 5B is a sectional view showing a metal oxide film formed by the film forming method according to the second embodiment of the present disclosure.

In this comparative example, an organic metal precursor is used as the precursor and a concentration of the $O_3$ gas is increased to strengthen an oxidizing power thereof. Under this condition, oxidization of the organic metal precursor adsorbed onto the wafer W causes, as shown in FIG. 5A, a thickness of a formed metal oxide film 50 to become thick in a periphery E of the wafer W and thin in a central portion C thereof. The reason for this is that, when the organic metal precursor is used as the precursor, ligands L become organic ligands such as $CH_3$ or $C_2H_5$, but the $O_3$ gas having the increased concentration causes a strong oxidizing power, thus oxidizing the organic ligands L. As described above, the oxidization of the organic ligands L generates a $H_2O$ gas or a $CO_x$ gas. When nitrogen is contained in the organic metal precursor, a $NO_x$ gas is additionally generated.

Specifically, the $H_2O$ gas inactivates the $O_3$ gas. This creates a situation where the $O_3$ gas hardly reaches the central portion C of the wafer W, thus making it difficult to oxidize the central portion C of the wafer W. As a result, the metal oxide film 50 is formed to have a thick thickness in the periphery E of the wafer W and a thin thickness in the central portion C thereof.

In addition, the $O_3$ gas is consumed in the course of both the oxidation of the metal and the oxidation of the organic ligands L, which deteriorates the actual oxidizing power even weaker than a designed oxidizing power. This makes it difficult to form the metal oxide film 50 having a dense and good high quality.

According to the above embodiment of the present disclosure, in the first supply process (5), the $O_3$ gas having a relatively low concentration is used to separate the organic ligands L from the organic metal precursor. In addition, the first supply process (5) is performed under conditions where the separated organic ligands L are not oxidized. Thereafter, the organic ligands L are exhausted from the processing chamber 1 (in process (7)). Subsequently, in the second supply process (6), the concentrated $O_3$ gas having a relatively high concentration is used to separate the organic ligands L from the organic metal precursor. Thus, the metal-hydroxy group (M-OH) or the metal-oxygen-metal (M-O-M) which is exposed on the wafer W, is oxidized.

As described above, according to the above embodiment, since the organic ligands L are separated in the first supply process (5), although the concentrated $O_3$ gas having relatively high concentration is used in the second supply process (6), it is possible to prevent, e.g., the $H_2O$ gas from being generated, thereby preventing the $O_3$ gas from being inactivated.

Therefore, according to this embodiment as shown in FIG. 5B, the metal oxide film 50 is uniformly formed on the wafer W over all areas including the periphery E and the central portion C of the wafer W. As a result, even if the concentration of the oxidant gas used in oxidizing the metal is increased to strengthen the oxidizing power thereof, it is possible to form the metal oxide film 50 with good in-plane uniformity.

In addition, in the second supply process (6), since the metal-hydroxy group (M-OH) or the metal-oxygen-metal (M-O-M) is oxidized under a state where almost none of the organic ligands L exist, hardly none of the concentrated $O_3$ gas is consumed for the oxidation of the organic ligands L. Therefore, the actual oxidizing power becomes very close to the designed oxidizing power. This makes it possible to form the metal oxide film 50 with a dense and good film quality as compared to that in the comparative example.

(Oxidant Gas Supply Source)

Figure 6:
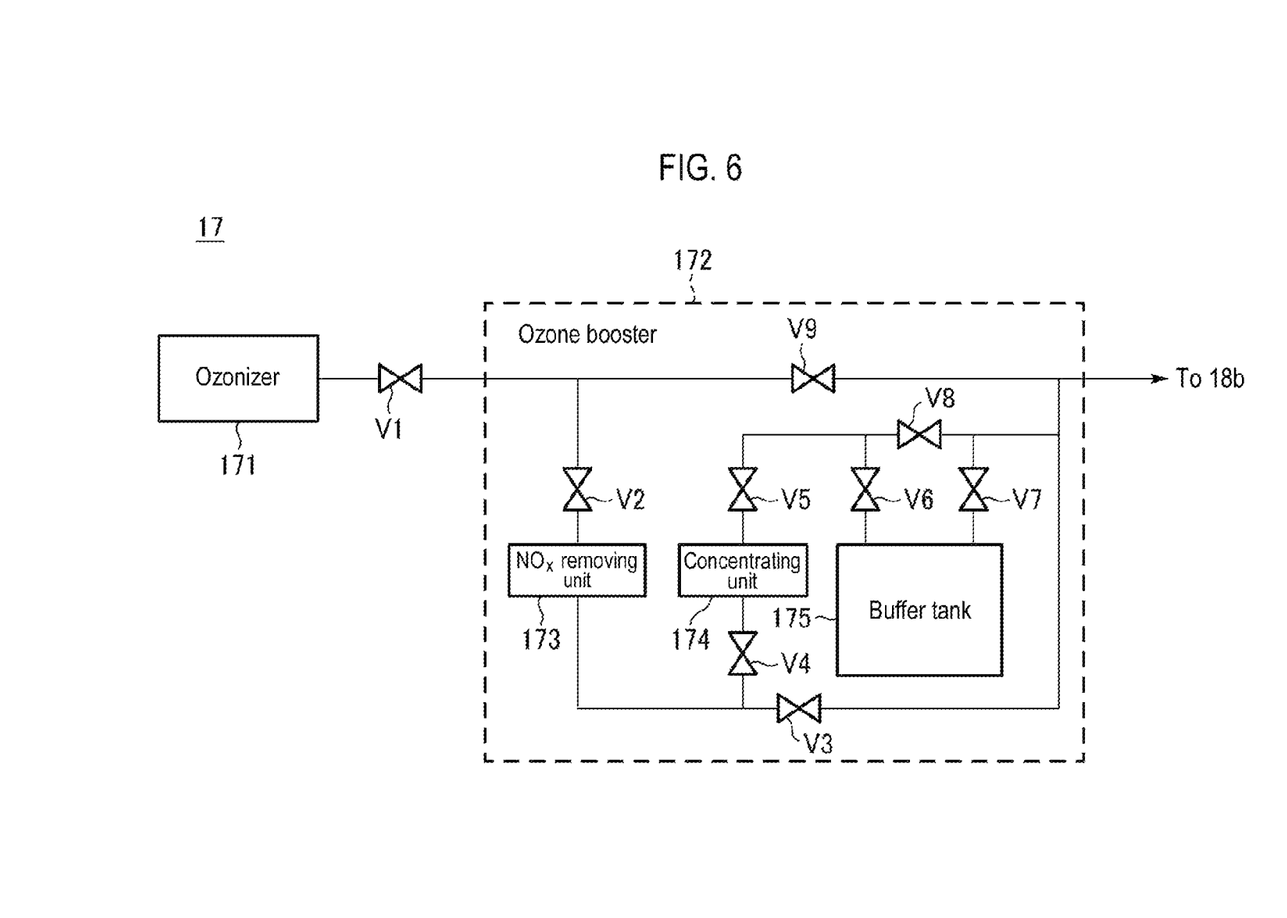
FIG. 6 is a block diagram showing an example of a configuration of a oxidant gas supply source which is provided to perform the film forming method according to the second embodiment of the present disclosure.

Next, an example of the oxidant gas supply source 17 which is provided to perform the film forming method according to the second embodiment of the present disclosure will be described.

FIG. 6 is a block diagram showing an example of a configuration of the oxidant gas supply source 17 which is provided to perform the film forming method according to the second embodiment of the present disclosure.

As shown in FIG. 6, the oxidant gas supply source 17 includes an oxidant gas generating unit configured to generate the oxidant gas (e.g., the $O_3$ gas), and an oxidant gas booster configured to concentrate the oxidant gas generated in the oxidant gas generating unit and generate a concentrated oxidant gas. In this example, an ozonizer 171 is used as the oxidant gas generating unit and an ozone booster 172 is used as the oxidant gas booster.

The ozonizer 171 generates the $O_3$ gas using a silent discharge. The generated $O_3$ gas is sent to the ozone booster 172 through a valve V1.

The ozone booster 172 includes a first path through which the $O_3$ gas generated in the ozonizer 171 directly flows to the flow rate controller 18b, a second path in which a nitrogen oxide ($NO_x$) contained in the $O_3$ gas is removed by a $NO_x$ removing unit 173, and a third path through which the concentrated $O_3$ gas flows to the flow rate controller 18b.

The first path through which the $O_3$ gas generated in the ozonizer 171 directly flows to the flow rate controller 18b is used in the first supply process (5). Specifically, in the first supply process (5), the $O_3$ gas generated in the ozonizer 171 is supplied into the processing chamber 1 through the flow rate controller 18b. The valve V1 is installed between the ozonizer 171 and the ozone booster 172. A valve V2 is used to guide the $O_3$ gas flowing through the valve V1 to the $NO_x$ removing unit 173. A valve V4 is used to guide the $O_3$ gas to the third path (as a concentration path) in which the $O_3$ gas is subjected to a concentration process. Valves V5 to V8 are arranged in the concentration path. A bypass valve V9 is used to allow the concentrated $O_3$ gas to bypass the ozone booster 172. When the valves V4 to V9 are closed and the valves V1 and V2 are opened, the $O_3$ gas generated in the ozonizer 171 is sent to the $NO_x$ removing unit 173. The $NO_x$ removing unit 173 is configured to remove the nitrogen oxide ($NO_x$) contained in the $O_3$ gas that is generated by the silent discharge. The nitrogen oxide-free $O_3$ gas is sent to the flow rate controller 18b through a valve V3.

The third path is used in the second supply process (6) to generate the concentrated $O_3$ gas. Specifically, the second supply process (6) includes concentrating the $O_3$ gas generated in the ozonizer 171 using a concentrating unit 174 of the ozone booster 172 and supplying the concentrated $O_3$ gas into the processing chamber 1 via the flow rate controller 18b. When the valve V3 is closed and the valve V4 is opened, the $O_3$ gas is guided to the concentrating unit 174 where it is subjected to the concentration process. Thus, the concentrated $O_3$ gas is supplied to the flow rate controller 18b. As described above, the valves V5 to V8 are installed in the concentration path. The valve V5 is used to discharge the concentrated $O_3$ gas obtained by the concentrating unit 174 therethrough. The valve V6 is used to guide the concentrated $O_3$ gas to a buffer tank 175. The valve V7 is used to discharge the concentrated $O_3$ gas stored in the buffer tank 175 toward the flow rate controller 18b. The valve V8 is used to bypass the buffer tank 175. When the valve V8 is closed and the valves V4 to V7 are opened, the nitrogen oxide-free $O_3$ gas obtained at the $NO_x$ removing unit 173 flows to the concentrating unit 174. In the concentrating unit 174, the nitrogen oxide-free $O_3$ gas is concentrated. The concentrated $O_3$ gas is sent to the buffer tank 175. The concentrated $O_3$ gas charged in the buffer tank 175 is sent to the flow rate controller 18b by opening the valve V7.

In some embodiments, the concentration process of the $O_3$ gas may be performed in the course of forming the metal oxide film 50 without involving the second supply process (6). With this configuration, it is possible to generate the concentrated $O_3$ gas during the formation of the metal oxide film 50 without involving the second supply process (6), and charge the concentrated $O_3$ gas in the buffer tank 175 (indicated by "charge" in FIG. 3). In the second supply process (6), the concentrated $O_3$ gas charged in the buffer tank 175 is discharged to the processing chamber 1 while maintaining the charge of the buffer tank 175 at a constant level. This makes it possible to prevent the concentrated $O_3$ gas from being insufficient during the formation of the metal oxide film 50.

The bypass valve V8 is used to exhaust or purge the concentration path through which the concentrated $O_3$ gas generated in the concentrating unit 174 flows. By opening the bypass valve V8 and closing the valves V6 and V7, the concentrated $O_3$ gas generated in the concentrating unit 174 can be directly sent to the flow rate controller 18b. Similarly, the bypass valve V9 is used to exhaust or purge the first path through which the $O_3$ gas generated in the ozonizer 171 is flows.

As described above, the oxidant gas supply source 17 including the ozone booster 172 configured as above can be used to perform the film forming method according to the second embodiment of the present disclosure.

Although the present disclosure has been described according to some embodiments, the present disclosure is not limited thereto. A variety of modifications may be made without departing from the spirit of the disclosures. The above embodiment is not unique for embodiments of the present disclosure.

While in the above embodiments the material being liquid at room temperature has been described to be used as the source, in some embodiments the material may be solid. In addition, while in the above embodiments, the substrate processing apparatus has been described with the batch-type vertical substrate processing apparatus, the present disclosure is not limited to thereto.

Furthermore, while in the above embodiments, the specific process conditions has been described to be applied in the first supply process (5) and the second supply process (6), the process conditions may be changed in various ways. In some embodiments, an oxide film can be formed by setting the supply process (3) of supplying the oxidant gas into the processing chamber 1 to include the first supply process (5) of supplying the oxidant gas at the first concentration and the second supply process (6) of supplying the oxidant gas at the second concentration higher than the first concentration.

Furthermore, while in the above embodiments, as indicated by process (2) in FIG. 3, the gas remaining in the processing chamber 1 has been described to be removed by exhausting the processing chamber 1 into which the film-forming raw material gas is supplied, followed by supplying the purge gas into the processing chamber 1, the present disclosure is not limited thereto. In an alternative embodiment, only one of the exhaustion of the processing chamber 1 and the supply of the purge gas into the processing chamber 1 may be performed.

Similarly, in process (4), only one of the exhaustion of the processing chamber 1 and the supply of the purge gas into the processing chamber 1 may be performed.

According to the present disclosure in some embodiments, it is possible to provide a method and apparatus which is capable of forming a metal oxide film having a dense and good in-plane uniformity even when a concentration of an oxidant gas used to oxidize metal is increased to strengthen an oxidizing power thereof.

While certain embodiments have been described, these embodiments have been presented by way of example only, and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a metal oxide film on an object to be processed by repeatedly performing a cycle comprising:
   supplying a film-forming raw material gas including an organic metal precursor into a processing chamber for the organic metal precursor to be adsorbed onto the object to be processed;
   performing at least one of exhausting the processing chamber and supplying a purge gas into the processing chamber to remove gas remaining in the processing chamber;
   supplying a first oxidant gas into the processing chamber at a first concentration of the first oxidant gas to separate organic ligands contained in the organic metal precursor from the organic metal precursor while leaving metals contained in the organic metal precursor on the object to be processed under conditions where the separated organic ligands are not oxidized;
   exhausting the processing chamber to remove the organic ligands, which are separated from the organic metal precursor, from the processing chamber;
   supplying a second oxidant gas into the processing chamber at a second concentration of the second oxidant gas higher than the first concentration of the first oxidant gas to oxidize the metals left on the object to be processed under a state where almost none of the organic ligands exist; and
   performing at least one of exhausting the processing chamber and supplying the purge gas into the processing chamber to remove gas remaining in the processing chamber.

2. The method of claim 1, wherein the organic ligands contain hydrocarbon.

3. The method of claim 1, wherein the first concentration of the first oxidant gas falls within a range of 50 g/Nm$^3$ to 200 g/Nm$^3$,
   wherein the second concentration of the second oxidant gas falls within a range of 200 g/Nm$^3$ to 500 g/Nm$^3$.

4. The method of claim 1, wherein a series of supplying a film-forming raw material gas to performing at least one of exhausting the processing chamber and supplying the purge gas are performed several times.

5. The method of claim 1, wherein each of the first and second oxidant gas is an ozone gas.

6. The method of claim 1, wherein supplying a first oxidant gas is performed by supplying the first oxidant gas generated by an oxidant gas generating unit into the processing chamber, and
   wherein supplying a second oxidant gas is performed by concentrating the first oxidant gas generated by the oxidant gas generating unit and supplying a concentrated first oxidant gas as the second oxidant gas into the processing chamber.

7. The method of claim 6, wherein the first oxidant gas is concentrated in the course of forming the oxide film without involving supplying a second oxidant gas, and
   wherein the concentrated first oxidant gas is generated in the course of forming the oxide film without involving supplying a second oxidant gas.

8. The method of claim 7, wherein the concentrated first oxidant gas is charged in a buffer tank, and
   wherein supplying a second oxidant gas is performed by supplying the concentrated first oxidant gas charged in the buffer tank into the processing chamber.

* * * * *